United States Patent
Cohen et al.

(10) Patent No.: US 6,668,820 B2
(45) Date of Patent: Dec. 30, 2003

(54) MULTIPLE REFLECTOR SOLAR CONCENTRATORS AND SYSTEMS

(76) Inventors: Gilbert E. Cohen, 115 White Bloom La., Morrisville, NC (US) 27560; Roland Winston, 5217C S. University Ave., Chicago, IL (US) 60615

( * ) Notice: Subject to any disclaimer, the term of this patent is extended or adjusted under 35 U.S.C. 154(b) by 0 days.

(21) Appl. No.: 09/939,261

(22) Filed: Aug. 24, 2001

(65) Prior Publication Data

US 2003/0037814 A1 Feb. 27, 2003

(51) Int. Cl.[7] ............................. F24J 2/18; H01L 31/052
(52) U.S. Cl. ........................ 126/685; 126/246; 126/259
(58) Field of Search ................................. 136/246, 259, 136/248; 126/690–694, 680, 685; 359/850, 853, 859, 861, 884

(56) References Cited

U.S. PATENT DOCUMENTS

| | | | | |
|---|---|---|---|---|
| 4,131,485 A | * | 12/1978 | Meinel et al. | 136/259 |
| 4,147,158 A | * | 4/1979 | Chieh-Tsung | 126/685 |
| 4,173,213 A | * | 11/1979 | Kelly | 126/604 |
| 5,062,899 A | * | 11/1991 | Kruer | 136/259 |
| 5,578,140 A | * | 11/1996 | Yogev et al. | 136/246 |
| 5,979,438 A | * | 11/1999 | Nakamura | 126/680 |

* cited by examiner

*Primary Examiner*—Nam Nguyen
*Assistant Examiner*—Brian L. Mutschler
(74) *Attorney, Agent, or Firm*—Brian D. Voyce

(57) ABSTRACT

The present invention relates to multiple reflector light or solar energy concentrators and systems using such concentrators. More particularly, the invention is concerned with an arrangement of optical elements for the efficient collection of light while minimizing complexities of optics needed to achieve light collection and concentration. At least three reflectors are involved. A concave primary reflector receives the solar energy and sends it to a secondary convex reflector positioned in the focal zone of the first reflector. In turn, the secondary reflector sends the solar energy, at least in part, to a third non-imaging reflector positioned in the focal zone of the secondary reflector. In a system, a receiver is placed in the focal zone of the third reflector. The present arrangement allows for the receiver to be in a fixed position, enhancing the ability of certain variants of the system to generate steam directly in the receiver. Preferred embodiments of the concentrator can be either in a trough or a dish configuration.

2 Claims, 7 Drawing Sheets

PRIOR ART

MULTIPLE REFLECTOR SOLAR CONCENTRATORS AND SYSTEMS

TECHNICAL FIELD

The present invention relates to multiple reflector light or solar energy concentrators incorporating folded optics and systems using such concentrators. More particularly, the invention is concerned with an arrangement of optical elements for the efficient collection of light while minimizing complexities of optics needed to achieve light collection and concentration. At least three reflectors are involved. In a system, a receiver is placed in the focal zone of the third reflector. The present arrangement allows for the receiver to be in a fixed position, enhancing the ability of certain variants of the system to generate steam directly in the receiver. Preferred embodiments of the concentrator can be either in a trough or a dish configuration.

BACKGROUND ART

Solar concentrators are used in a variety of energy collection applications and can include large-scale uses that involve numerous unit systems spread over a wide area. Such systems are becoming more significant in view of growing power demands and particularly are of interest in third world countries where infrastructure and large land masses do not lend itself to construction of conventional power plants and distribution systems. However, the current solar concentrators suffer from certain insufficiencies. The mechanical elements and optical systems are complex, resulting in extremely high maintenance costs in electrical power generation and/or thermal based energy collection.

A recent example of a large-scale parabolic trough concentrator can be found in U.S. Pat. No. 5,460,163. A trough shaped mirror extends in a longitudinal direction. The reflector has a focal zone in which is placed a linear heat pipe receiver. The receiver is fixed in relation to the reflector, and thus, moves as the reflector tracks the sun's diurnal movement.

Another linear reflector design is disclosed in U.S. Pat. No. 4,173,213. A series of split linear parabolic reflectors are used, an outer one is placed within the aperture of an inner one.

A parabolic dish concentrator is related in U.S. Pat. No. 5,882,434. A parabolic primary reflector has a flat region at the center of the dish forming an annular focal zone. A receiver in the form of a truncated cone is placed inverted such that the peripheral surface of the cone is in the annular focal zone. Photovoltaic cells are placed on the receiver's peripheral surface.

A multiple primary reflector Fresnel system is disclosed in U.S. Pat. No. 5,899,199 to David Mills. An array of primary reflectors is arranged so as to reflect a large-scale linear target receiver.

A Cassegranian form of solar reflector is described in an article by Charles E. Mauk et alia, (*Optical and Thermal Analysis of a Cassegrainian Solar Concentrator,* Solar Energy Vol. 23, pp. 157–167, Pergamon Press Ltd. 1979). A hyperbolic reflector is placed in the focal zone of a parabolic dish primary reflector. The focus of the hyperbola is directed to the center of the primary parabola, where a furnace is placed to receive solar energy.

DISCLOSURE OF THE INVENTION

The present invention relates to multiple reflector solar energy concentrators and systems using such concentrators. More particularly, the invention is concerned with an arrangement of optical elements for the efficient collection of light while minimizing complexities of optics needed to achieve light collection and concentration. At least three reflectors are involved. A concave primary reflector receives the solar energy and sends it to a secondary convex reflector positioned in the focal zone of the first reflector. In turn, the secondary reflector sends the solar energy, at least in part, to a third non-imaging reflector positioned in the focal zone of the secondary reflector. In an energy collection system, a receiver is placed in the focal zone of the third reflector. The present arrangement allows for the receiver to be in a fixed position, enhancing the ability of certain variants of the system to generate steam directly in the receiver. Preferred embodiments of the concentrator can be either in a trough or a dish configuration.

The present invention has flexibility in the particular design of the reflectors. However, to maximize energy collection, the shape of each reflector affects the shape of the other reflectors. The primary reflector can vary from a circular arcuate shape to a parabolic shape. The change in shape will vary the position and size of the first focal zone. Thus, where the secondary reflector is placed in relation to the primary reflector and the precise shape of the secondary reflector, preferably a hyperbola, will vary as well. In turn, where the tertiary reflector is placed in relation to the secondary reflector and the precise shape of the tertiary reflector, preferably a compound parabola, will vary as well. In general, the tertiary reflector will be located adjacent to or in close proximity to the primary reflector, as shown in FIG. 1. To determine an optimal set of configurations, one can use conventional genetic algorithms to solve for the multiple solutions, as is known to those of skill in the art. Typically, one would select a set of reflector shapes that would reflect into the third focal zone at least 90% of the light energy falling within the aperture of the primary reflector.

In one broad embodiment, a solar energy trough concentrator comprises three reflectors. A primary reflector has a linear concave configuration that defines a first focal zone, and has a first longitudinal axis. A secondary reflector has a linear convex configuration that defines a second focal zone and has a second longitudinal axis in parallel alignment with the first longitudinal axis. The secondary reflector is disposed within the first focal zone. A tertiary reflector has a linear non-imaging configuration that defines a third focal zone and has a third longitudinal axis in parallel alignment with the first and second longitudinal axes. The tertiary reflector is disposed within the second focal zone. With this novel arrangement, light energy reflecting from the primary reflector is directed first to the secondary reflector, next to the tertiary reflector, and finally into the third focal zone.

In another broad embodiment, a solar energy dish concentrator comprises three reflectors as well. A primary reflector has a circular concave configuration that defines a first focal zone and has a first longitudinal axis. A secondary reflector has a circular convex configuration that defines a second focal zone. The secondary reflector is disposed within the first focal zone. A tertiary reflector has a circular non-imaging configuration that defines a third focal zone. The tertiary reflector is disposed within the second focal zone. With this novel arrangement, light energy reflecting from the primary reflector is directed first to the secondary reflector, next to the tertiary reflector, and finally into the third focal zone.

An object of the invention is to provide an improved solar collector system.

Another object of the invention is to provide a novel optical solar concentrator having a primary reflector with transducer decoupled from a secondary reflector.

A primary object of the invention is to permit an energy receiver to be placed in a final concentrating focal zone such that the receiver either does not have to move or moves only in a rotary fashion.

A further object of the invention is to provide an improved solar concentrator system having a tailored surface contour for both a primary and secondary reflector.

An additional object of the invention is to provide a novel solar collector device having a tailored parabolic primary reflector, a tailored hyperbolic secondary reflector, and a tailored non-imaging trough encompassing a receiver.

Still a further object of the invention is to provide an improved solar collector system having a secondary reflector system enabling selective transmission and reflection of light wavelengths to enable creation of photovoltaic power as well as collection and concentration of solar energy.

Yet another object of the invention is to provide a novel solar collector system having a solar transducer associated with the secondary reflector system enabling photoelectric energy to be produced for controlling and/or moving the solar collector system.

Other objects, advantages and variations of the invention will become apparent from the detailed description and drawings described hereinafter.

BEST MODES FOR CARRYING OUT THE INVENTION

Figure 1:
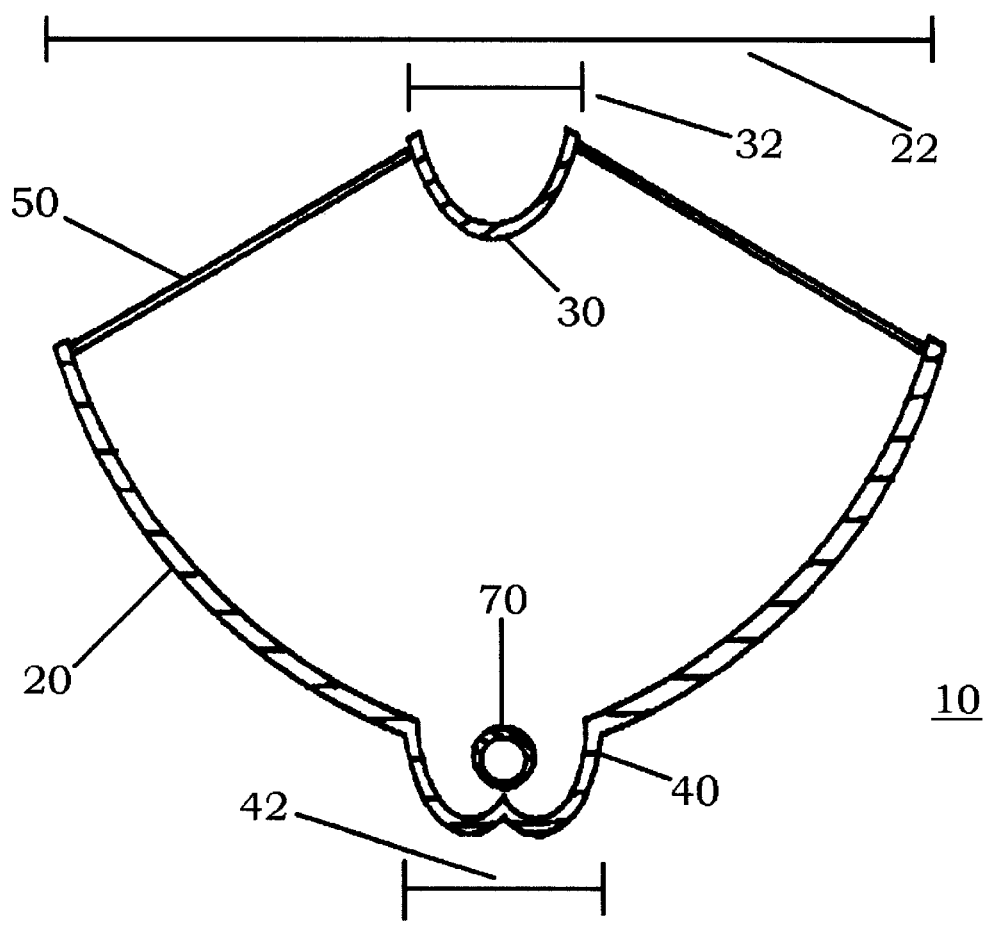
FIG. 1 illustrates a cross-sectional view of one preferred embodiment of the present multiple reflector concentrator using a compound parabolic tertiary.

A preferred three-reflector embodiment of the present invention is shown in FIG. 1. A solar energy concentrator (10) comprises a primary reflector (20) having a truncated parabolic configuration that defines a primary aperture (22) and a first focal zone. Disposed within the first focal zone is a secondary reflector (30) having a hyperbolic configuration that defines a secondary aperture (32) and a second focal zone. Conventional structural support means (50) can be used to hold the secondary reflector in alignment with the primary reflector. However, a more complex movable tracking arrangement can also be used. Disposed within the second focal zone is a tertiary reflector (40) having a non-imaging configuration (such as a compound parabolic shape) that defines a tertiary aperture (42) and a third focal zone. The tertiary reflector can be connected to the primary reflector, as shown. Light energy reflecting from the primary reflector is directed first to the secondary reflector, next to the tertiary reflector, and finally into the third focal zone.

For a perspective on the concentrating power that can be achieved with the present invention, one can look to the relative reflector apertures in a representative, but not limiting, example of the present invention. If the primary aperture is about five meters, then the secondary aperture can be about 150 millimeters, and the tertiary aperture can be about 40 millimeters.

Figure 2:
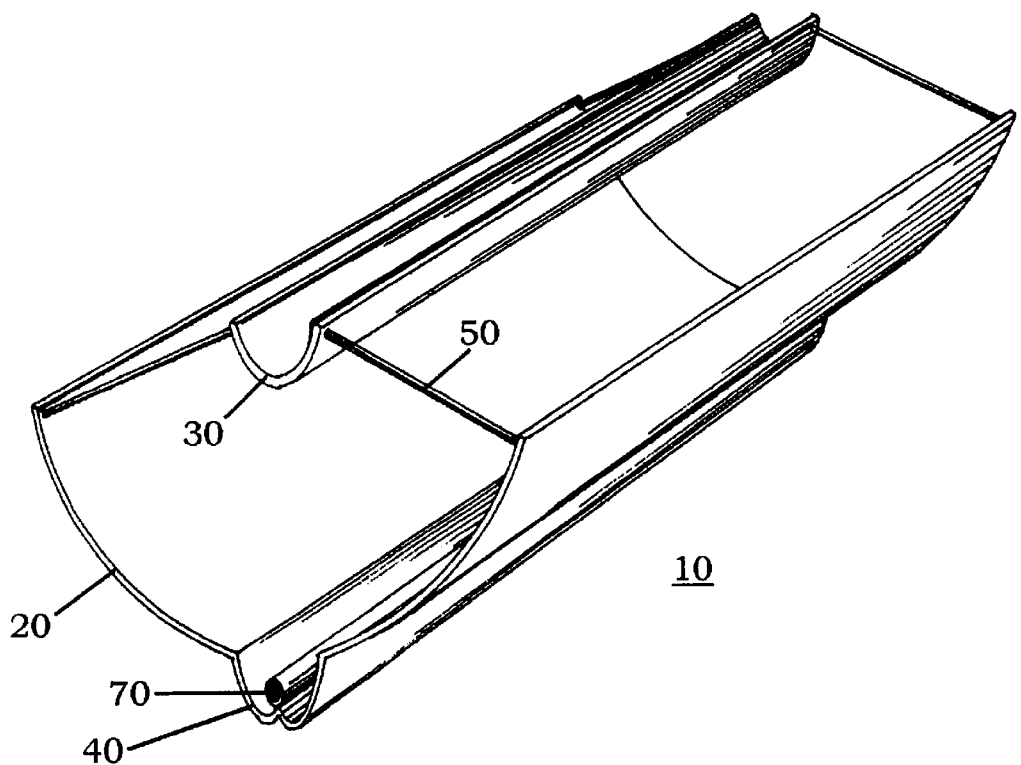
FIG. 2 illustrates a perspective view of a preferred linear trough embodiment of the present invention.

In a trough variant, the primary reflector is linear, and thus, also has a first longitudinal axis about which the cross section has been made and which can be seen in FIG. 2. The secondary reflector is linear as well, and thus also, has a second longitudinal axis in parallel alignment with the first longitudinal axis. In turn, the tertiary reflector has a third longitudinal axis in parallel alignment with the first and second longitudinal axes.

Figure 3:
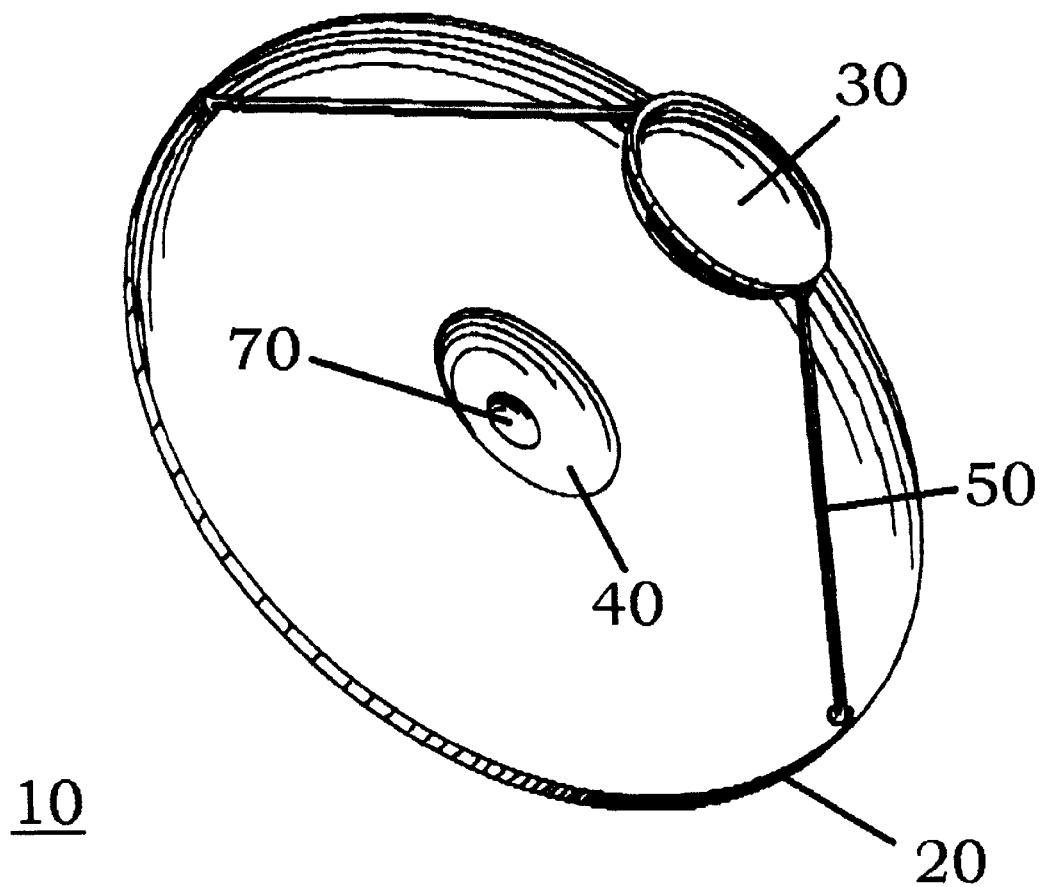
FIG. 3 illustrates a perspective view of a preferred dish embodiment of the present invention.

In a dish concentrator, the reflectors would have circular configurations as shown in FIG. 3, as opposed to the linear configurations of the trough concentrator.

Figure 4:
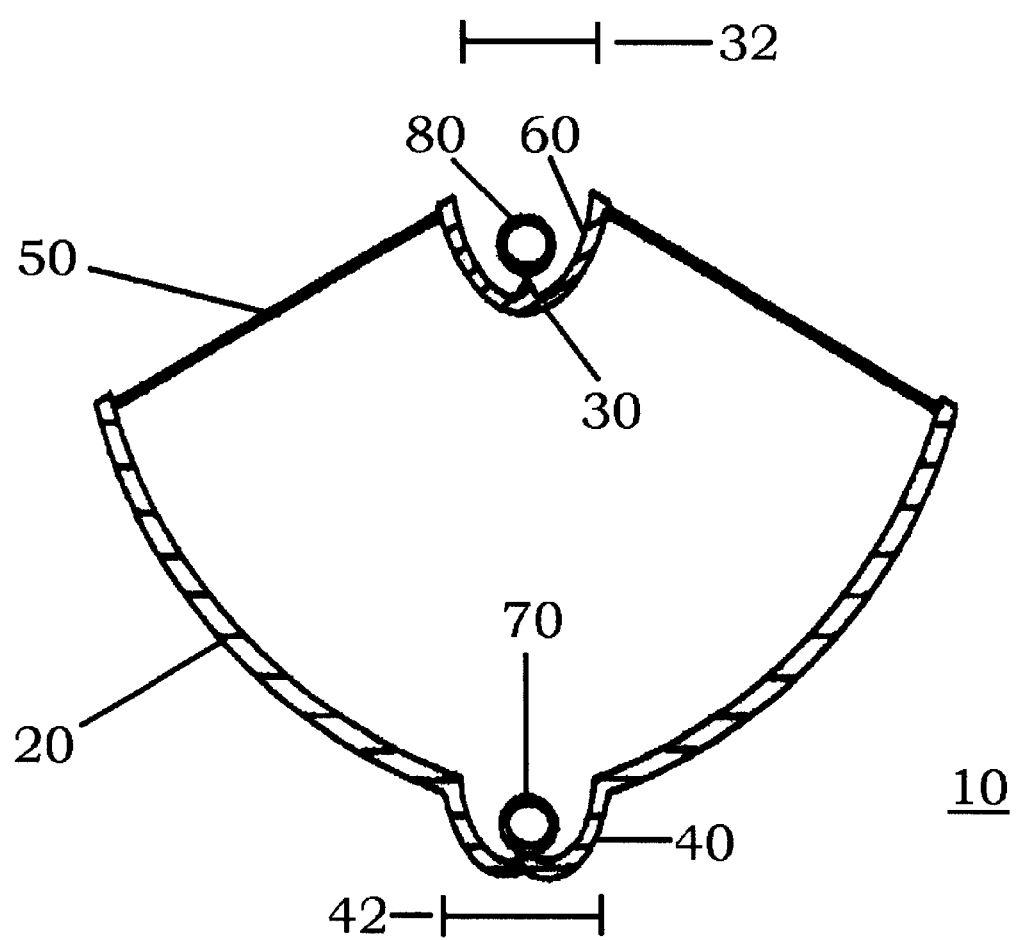
FIG. 4 illustrates a cross-sectional view of a preferred embodiment also incorporating a quaternary reflector.

Another preferred embodiment of the present invention uses a fourth additional reflector, as shown in FIG. 4. The fourth or quaternary reflector (60) has a non-imaging configuration that defines a fourth focal zone. The fourth reflector is disposed on the non-convex face of the secondary reflector within the dimensions of the secondary aperture. One can orient the reflective face of the quaternary reflector in the same direction as that of the primary reflector. Alternatively, one can orient the reflective face of the quaternary reflector in the same direction as that of the secondary reflector. In this case, the non-convex side of the secondary reflector (having a concave configuration) serves as a quintiary reflector having a reflective surface (34) having a fifth focal zone. The quaternary reflector is disposed in that fifth focal zone. Light energy reflecting from the quintiary reflector is directed to the quaternary reflector and into the fifth focal zone.

A fourth reflector embodiment is particularly useful in an energy collection system where one desires to pre-heat a fluid medium. In particular, one can use a receiver (70) located in the tertiary reflector focal zone and a pre-heating receiver (80) located in the quaternary focal zone. Before fluid flow through the receiver, it first flows through the pre-heating receiver.

In a trough concentrator, the fourth reflector has a fourth longitudinal axis in parallel alignment with the second longitudinal axis, the quaternary reflector being disposed on the non-convex face of the secondary reflector.

In yet another preferred embodiment, one can use the concentrators described above with the addition of a selective secondary reflector. Such a configuration is particularly suitable for generating electricity using a photovoltaic device. The reflector is made from known wavelength selective materials using conventional processes so that a portion of light energy from the primary reflector passes through the secondary reflector. Typically, one would use a selectivity that passes through a range of energy of substantial efficiency for a photovoltaic device disposed so as to receive such light energy, such as in the near infrared range. Electrical power from the photovoltaic device can be used to control the concentrator position as well as other control systems associated with the collector system.

A solar energy collector system can be constructed in accordance with the invention. The system would include optics as described for the above concentrators. A first linear receiver (70) is disposed within the third focal zone, along the third longitudinal axis. A conventional means for rotating the solar energy concentrator to track diurnal solar movement is attached to the concentrator (10). Preferably, the receiver is fixed such that while the concentrator moves, the receiver does not. Thus, the need is eliminated for complex rotating ball joints as used in the prior art. Such joints are not only expensive to purchase, but also require a significant amount of maintenance. With such a system, one can pass water through the receiver so as to create steam within the receiver. Direct steam generation eliminates the capital cost of an energy transfer fluid and a heat exchanger. If one is building a large-scale system with rows of trough concentrators, then one can space the troughs apart from each other. Typically this spacing would be at least about three times the primary aperture. Also, one can place the concentrators at a height at least high enough so that the concentrators can be rotated so as to place the primary aperture in a non-collection mode, either for maintenance, storage, or in case of a receiver flow problem such as stagnation or blockage.

An alternative preferred energy collection system would use dish concentrators as described above. A conventional means for rotating the solar energy dish to track diurnal solar movement is attached to the concentrator (10), preferably having two axes movement. A means for transducing light energy, such as a heat engine may be located in the third focal zone. Alternatively a receiver may be disposed there. For large-scale systems, a plurality of dish concentrators may be used and a means is provided for connecting either each receiver or each thermal energy transfer means.

Figure 5:
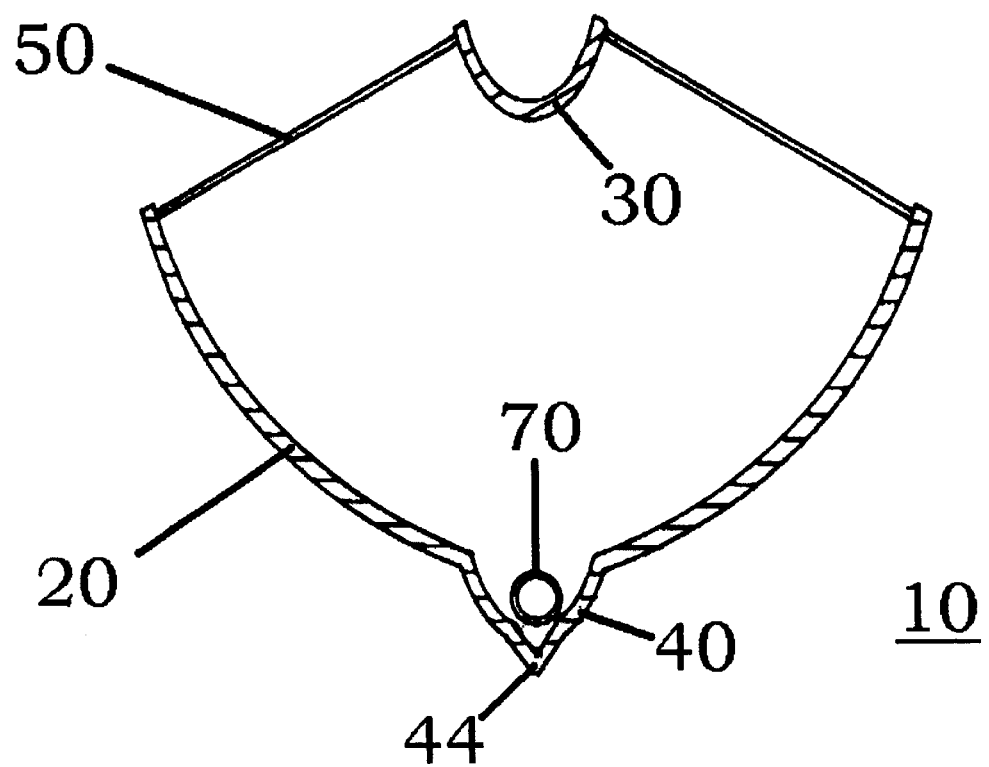
FIG. 5 illustrates a cross-sectional view of another preferred embodiment of the present multiple reflector concentrator using a notched tertiary reflector.

Particularly advantageous tailoring methodologies for non-imaging reflectors are known to the art. Dr. Roland Winston and his associates have disclosed them in their publications which include U.S. Pat. Nos. 6,205,998; 5,967,140; 5,927,271; 5,537,991; and 5,335,152, all of which are incorporated by reference hereto. Thus, some concentrator embodiments of the present invention may use the structure shown in FIG. 5 wherein the tertiary reflector comprises a tailored compound parabolic shape and a V-notch (44).

In a conventional prior art system with a parabolic shape for a primary reflector with a conventional receiver centered about a focal point of the primary reflector, the concentration ratio ("CR") depends on the rim angle $\phi$ and for a truncated parabolic tubular receiver $CR = \sin \phi / \pi \alpha$, where $\alpha$ is the acceptance angle. CR maximizes at $\phi = \pi/2$, accounting for commercial parabolic troughs having rim angles close to 90 degrees. By replacing $\sin \alpha$ with $\alpha$ (using a small angle approximation for $\alpha$ because it is typically a few degrees, the limit to concentration becomes $CR = 1/\sin \approx 1/\alpha$. Thus, a simple parabolic trough falls short by a factor of $\pi$ (greater than 3).

Figure 6:
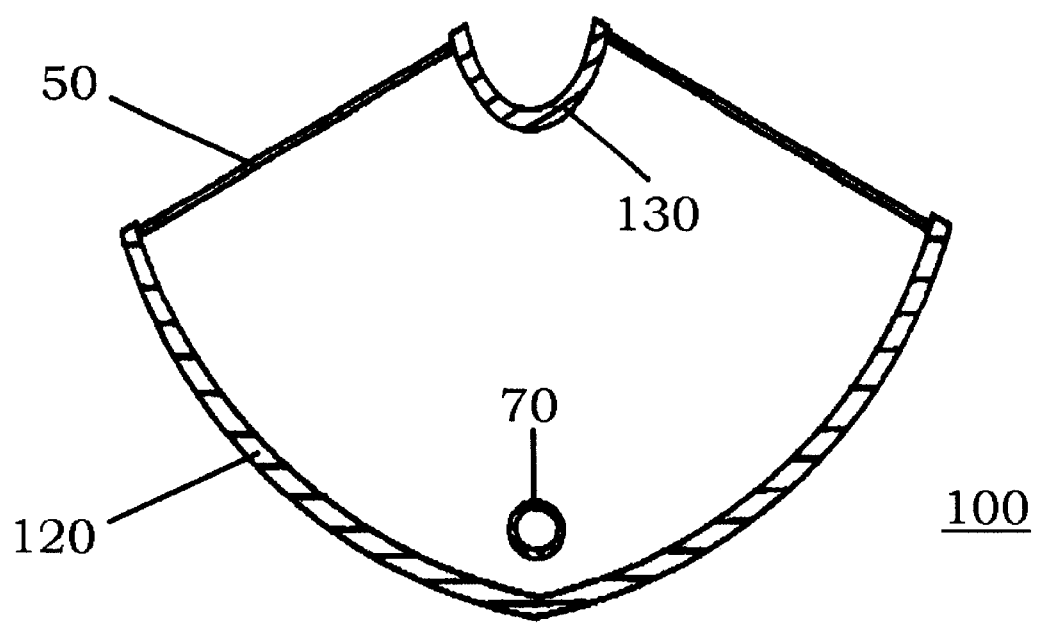
FIG. 6 illustrates a cross-sectional view of a prior art Cassegrania-type reflector concentrator.
Figure 7:
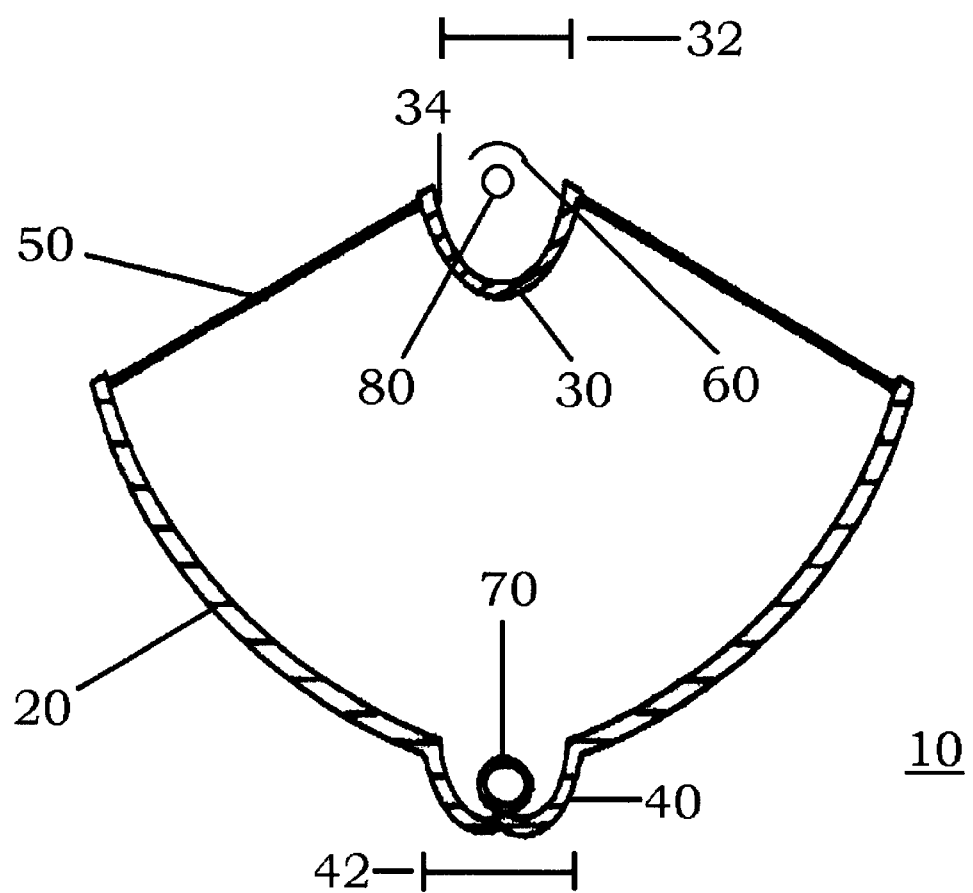
FIG. 7 illustrates a cross-sectional view of a preferred embodiment also incorporating a quintiary reflector.

In a conventional prior art system with a Cassegranian trough design having simply a primary reflector (120) and a secondary reflector (130), as seen in FIG. 6, the CR can be determined by introducing two auxiliary parameters, the focal length of the parabola ($f$) and the smaller of the two focal lengths of the hyperbola ($\alpha$). The other focal length of the hyperbola is close to $f$ in order to bring the final focus to the center of the parabola. For a parabola with rim angle $\phi$ close to 90 degrees, the aperture of the parabola is $4f$ (for $\phi = 90$ degrees) and similarly, the aperture of the hyperbola is close to $4\alpha$. The rim angle of the hyperbola will similarly have a rim angle close to 90 degrees. The size of the final "image" is obtained by tracing the edge rays. The edge rays subtending a half angle $\alpha$, when reflected from the rim of the parabola intercept a distance $4f\alpha$ at the parabolic focus. This distance subtends a (half angle) of $\beta = (f/\alpha)\alpha$. Therefore, the edge rays upon reflection by the hyperbolic reflector intercept a size of $A_1 = 2\beta f = 2(f^2/\alpha)\alpha$. As a consequence, the resulting CR for a Cassegranian version of the parabolic trough is $CR = 4f/A_1$ or $= 2(\alpha/f)/\alpha$. The fraction of incident radiation blocked by the hyperbolic reflector is $\alpha/f$ (less than 10%). Thus, the CR falls short of the theoretical limit ($1/\alpha$), by a factor greater than 5. That is why this version is not a useful design for applications, like solar thermal power, where CR is an important figure of merit.

In a preferred embodiment of the present concentrator (as seen in FIG. 1) a non-imaging tertiary concentrator has been added at the aperture $A_1$. The angular acceptance ($\theta$) of the tertiary concentrator is about $2\alpha/f$. The CR of the tertiary reflector is about $1/\theta$ or $= f/2\alpha$. Again assuming a small angle approximation, one concludes that the overall concentration is $1/\alpha$ the theoretical limit. With the secondary reflector (aperture being about $4\alpha$) and the tertiary reflector blocking incident radiation one makes the apertures approximately equal for CR purposes. Thus, $A_1 = 2\beta f = 2(f^2/\alpha)\alpha = 4\alpha$, where $\alpha$ equals $f\sqrt{(\alpha/2)}$. The fraction of incident radiation blocked is about $A_1/4f \approx \alpha/f = \sqrt{(\alpha/2)}$. For a typical value of $\alpha$ being 6 to 10 milliradians, the blocking fraction with the present invention would be in the range of about 5% to 7%.

The ordinarily skilled artisan can appreciate the present invention can incorporate any number of the preferred features described above.

All publications or unpublished patent applications mentioned herein are hereby incorporated by reference thereto.

Other embodiments of the present invention are not presented here which are obvious to those of ordinary skill in the art, now or during the term of any patent issuing from this patent specification, and thus, are within the spirit and scope of the present invention.

We claim:

1. A light energy trough concentrator system comprising:

a) a primary reflector having a linear concave configuration defining a first focal zone, and having a first longitudinal axis;

b) a secondary reflector having a linear convex configuration and a non-convex face defining a second focal zone and having a second longitudinal axis in parallel alignment with the first longitudinal axis, the secondary reflector being disposed within the first focal zone;

c) a tertiary reflector having a linear non-imaging configuration defining a third focal zone and having a third longitudinal axis in parallel alignment with the first and second longitudinal axes, the tertiary reflector being disposed within the second focal zone;

d) a first linear receiver disposed within the third focal zone, along the third longitudinal axis; and e) a second linear receiver disposed in a conductive relationship with the non-convex face of the secondary reflector;

wherein light energy reflecting from the primary reflector is directed first to the secondary reflector, next to the tertiary reflector, and finally into the third focal zone.

2. The light energy concentrating system of claim 1 wherein the second receiver preheats a fluid passing through the first receiver.

* * * * *